(12) United States Patent
Guidash

(10) Patent No.: US 6,504,195 B2
(45) Date of Patent: Jan. 7, 2003

(54) ALTERNATE METHOD FOR PHOTODIODE FORMATION IN CMOS IMAGE SENSORS

(75) Inventor: Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/750,941

(22) Filed: Dec. 29, 2000

(65) Prior Publication Data

US 2002/0121656 A1 Sep. 5, 2002

(51) Int. Cl.[7] .................... H01L 31/062; H01L 31/113
(52) U.S. Cl. ........................ 257/292; 257/187
(58) Field of Search .................... 257/187, 292, 257/458

(56) References Cited

U.S. PATENT DOCUMENTS

| | | | |
|---|---|---|---|
| 5,471,515 A | 11/1995 | Fossum et al. | 377/60 |
| 5,587,596 A | 12/1996 | Chi et al. | 257/223 |
| 5,608,243 A | 3/1997 | Chi et al. | 257/249 |
| 5,625,210 A | 4/1997 | Lee et al. | 257/292 |
| 5,631,704 A | 5/1997 | Dickinson et al. | 348/308 |
| 5,721,425 A | 2/1998 | Merrill | 250/214.1 |
| 5,760,458 A | 6/1998 | Bergemont et al. | 257/588 |
| 5,789,774 A | 8/1998 | Merrill | 257/292 |
| 5,838,650 A | 11/1998 | Campbell et al. | 369/103 |
| 5,847,422 A | 12/1998 | Chi et al. | 257/291 |
| 5,892,253 A | 4/1999 | Merrill | 257/292 |
| 5,995,163 A | 11/1999 | Fossum | 348/572 |
| 6,005,619 A | 12/1999 | Fossum | 348/315 |
| 6,008,486 A | 12/1999 | Stam et al. | 250/208.1 |
| 6,023,081 A | * 2/2000 | Drowley et al. | 257/290 |
| 6,040,592 A | * 3/2000 | McDaniel et al. | 257/291 |
| 6,040,593 A | * 3/2000 | Park | 257/233 |

FOREIGN PATENT DOCUMENTS

JP  03296280 A  * 12/1991 ........... H01L/31/10

OTHER PUBLICATIONS

Eiji Oba et al., "A 1/4 Inch 330k Square Pixel Progressive Scan CMOS Active Pixel Image Sensor", 1997 IEEE International Solid–State Circuits Conference, ISSCC97/Session11/Imaging Circuits and Systems/Paper FA 11.1, pp. 180–189 and p. 452–454.

Hon–Sum Wong, "Technology and Device Scaling Consideration For CMOS Images", IEEE Transactions on Electron Devices, vol. 43, No. 12, Dec. 1996, pp. 2131–2141.

Masanoti Ogata et al., "A Small Pixel CMD Image Sensor", IEEE Transactions on Electron Devices, vol. 38, No. 5, May 1991, pp. 1005–1010.

Fumihiko Andoh et al., "A 250,000–Pixel Image Sensor With FET Amplification At Each Pixel For High–Speed Television Cameras", 1990 IEEE International Solid State Circuits Conference, Feb. 1990, Session 13; Image Sensors, Processors, and Displays, pp. 212–213 & 298.

J.E.D. Hurwitz et al., "An 800K–Pixel Color CMOS Sensor For Consumer Still Cameras", VLSI Vision Ltd., Aviation House, 31 Pinkhill Edinburg, 1997.

* cited by examiner

Primary Examiner—Allan R. Wilson
(74) Attorney, Agent, or Firm—Peyton C. Watkins

(57) ABSTRACT

A complementary metal oxide semiconductor (CMOS) active pixel sensor (APS) having a plurality of pixels which includes at least one pixel entailing a photodetector, a transistor adjacent the photodetector having a silicide surface, and an insulator over the photodetector. The insulator has a thickness sufficient to prevent the silicide surface from forming over the photodetector and contains an insulator as a field oxide.

12 Claims, 5 Drawing Sheets

ALTERNATE METHOD FOR PHOTODIODE FORMATION IN CMOS IMAGE SENSORS

FIELD OF THE INVENTION

The present invention relates to the field of solid state photo-sensors and imagers, specifically to imagers referred to as Active and Passive Pixel Sensors, and more particularly, to a structure and process for efficiently controlling the silicidation of the photodetector within such sensors.

BACKGROUND OF THE INVENTION

Active Pixel Sensors (APS) are solid state imagers wherein each pixel contains a photodetector and some other active devices that perform control functions on the pixel. Passive pixel sensors (PPS) are imagers having photosensing means and address transistors, but no active components. Recent and prior art devices have focused on using commercially available CMOS foundry processes to manufacture APS and PPS devices. To overcome the limitations of CCD-based imaging circuits, more recent imaging circuits use complementary metal oxide semiconductors (CMOS) active pixel sensor (APS) cells to convert light energy into an electrical signal. With active pixel sensor cells, a conventional photodiode is typically combined with a number of active transistors which, in addition to forming an electrical signal, provide amplification, readout control, and reset control.

The use of CMOS to manufacture APS and PPS devices has a resulting advantage of easily integrating signal processing and control circuits on the same chip as the imager, thus making it easier to fabricate a camera on a single semiconductor device, and providing a low cost integrated digital imaging device. In APS and PPS devices typically fabricated using standard CMOS processes, the photodetector within the pixel has been either a photocapacitor, (also referred to as a photogate), or a photodiode. In order to provide low resistivity and low resistance CMOS transistors and contact regions, CMOS processes have employed refractory metal silicides over all active area and polysilicon regions. This is typically done in a self-aligned process so that all active area and polysilicon regions form refractory metal silicides selectively without the need for a photolithographic patterning step. The refractory metal silicides are undesirable in an image sensor photodetector since they are opaque to part of the visible spectrum of light. As a result, in order to build a CMOS APS or PPS device, extra process steps such as photolithographic patterning must be used to remove the silicide or to prevent the silicide formation over the photodetector. This adds cost and complexity to the APS or PPS fabrication process.

SUMMARY OF THE INVENTION

It is, therefore, an object of the present invention to provide a complementary metal oxide semiconductor (CMOS) active pixel sensor (APS) having a plurality of pixels which includes a photodetector, a transistor adjacent the photodetector having a silicide surface, and an insulator over the photodetector. The insulator has a thickness sufficient to prevent the silicide surface from forming over the photodetector.

The photodetector could be a pinned photodiode where a pinning layer is between the photodetector and the insulator. The photodetector is a doped region in the silicon substrate.

The transistor could be a reset transistor having a silicided source region adjacent the photodetector, a silicided gate adjacent the source region and a silicided drain region on an opposite side of the gate from the source. Alternatively, the transistor could be a transfer transistor having a silicided source region adjacent the photodetector, a silicided gate adjacent the source region and a silicided drain region on an opposite side of the gate from the photodetector. The transistor could also be a row select transistor having a silicided gate adjacent the photodetector and a silicided drain region on an opposite side of the gate from the photodetector.

The inventive method of forming a complementary metal oxide semiconductor pixel sensor includes supplying a substrate, doping of the first region of the substrate to form a photodetector and forming a transistor adjacent the photodetector. The formation of the transistor includes forming an insulator which covers the photodetector and siliciding conductive regions of the transistor and an insulator field oxide. If the photodetector were pinned photodiode, the invention would form a pinning layer over the photodetector. Doping of the first region can be performed either before or after the insulator has been formed. A reset transistor could be utilized by forming a silicided source region adjacent the photodetector, a silicided gate adjacent the source region and a silicided drain region on an opposite side of the gate from the source. A transfer transistor could be utilized by forming a silicided gate adjacent the photodetector region and a silicided drain region on an opposite side of the gate from the photodetector. The utilization of a row select transistor entails forming a silicided gate adjacent the photodetector and a silicided drain region on an opposite side of the gate from the photodetector.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Figure 1:
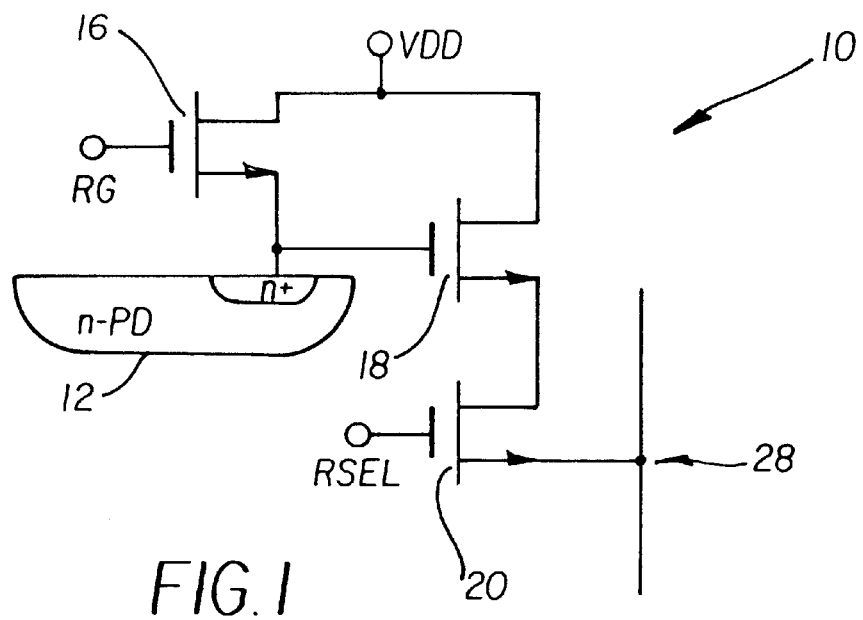
FIG. 1 is a schematic diagram of a CMOS APS pixel.

FIG. 1 is a schematic diagram that illustrates a CMOS active pixel sensor cell 10. As shown in FIG. 1, the cell 10 includes a photodiode 12, a reset transistor 16 with a reset gate RG, whose source is connected to the photodiode, and whose drain is connected to the voltage supply VDD, a signal transistor 18 whose gate is connected to the photodiode and whose drain is connected to the voltage supply VDD, a row select transistor 20 with a row select gate RSEL whose drain is connected to the source of the signal transistor and whose source is connected to the pixel output 28.

Figure 2:
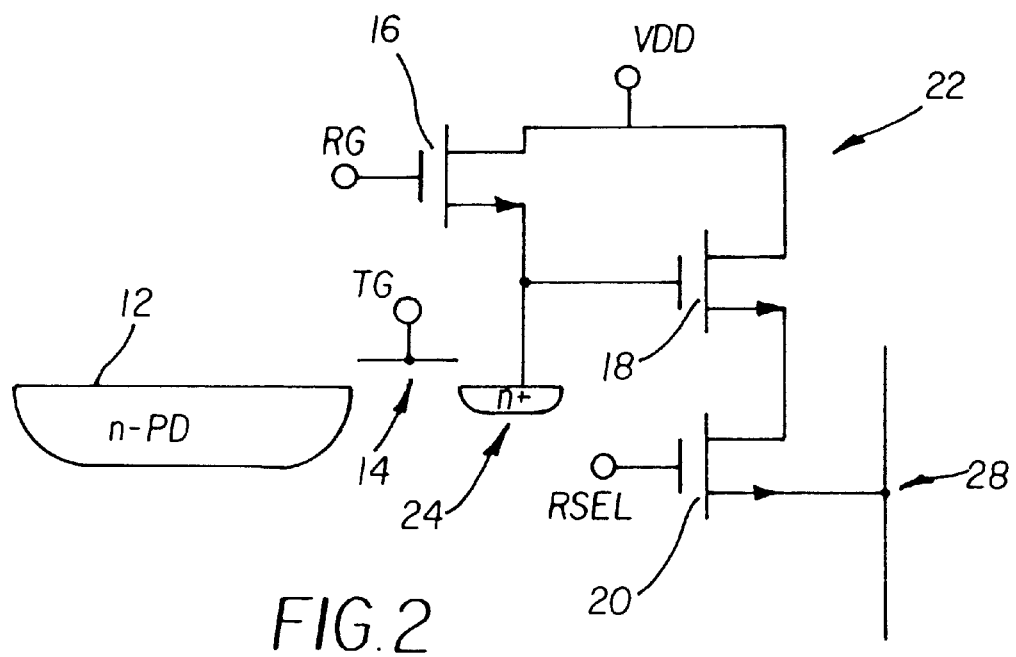
FIG. 2 is a schematic diagram of a second CMOS APS pixel.

FIG. 2 is a schematic diagram that illustrates a second conventional CMOS active pixel sensor cell 22. As shown in FIG. 2, the cell 22 includes a photodiode 12, a transfer transistor 14 with a transfer gate TG, whose source is the photodiode, and a reset transistor 16 with a reset gate RG, whose drain is connected to the voltage supply VDD. The drain of the transfer transistor 14 and the source of the reset transistor 16 are connected to form the sensing node 24. The sensing node 24 comprises a floating diffusion region. The pixel 22 also comprises a signal transistor 18 whose gate is connected to the sensing node 24 and whose drain is connected to the voltage supply VDD, a row select transistor 20 with a row select gate RSEL whose drain is connected to the source of the signal transistor and whose source is connected to the pixel output 28.

Figure 3:
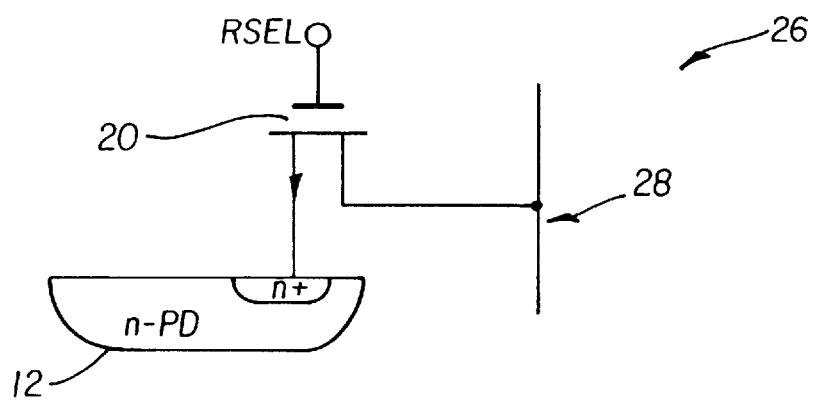
FIG. 3 is a schematic diagram of a CMOS PPS pixel.

FIG. 3 is a schematic diagram that illustrates a conventional CMOS passive pixel sensor cell 26. As shown in FIG. 3, the cell 26 includes a photodiode 12, a row select transistor 20 with a row select gate RSEL, whose source is connected to the photodiode, and whose drain is connected to the pixel output 28. The photodiode 12 has no refractory metal silicide over its surface. The row select transistor 20 must have its gate and drain silicided in order to retain desired transistor performance. The photodiode 12 can comprise a standard photodiode or a partially pinned photodiode as described in U.S. Pat. No. 6,051,447, incorporated herein by reference.

Figure 4:
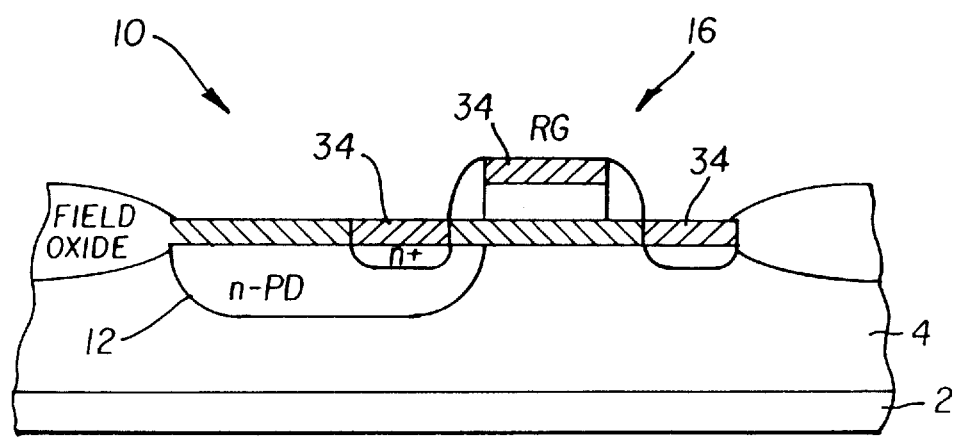
FIG. 4 is a cross sectional view of the photodiode region and reset transistor region of the CMOS APS pixel in FIG. 1.

FIG. 4 is a cross sectional diagram of the photodetector and adjacent reset transistor structure of the active pixel 10 illustrated in FIG. 1. The cell 10, is preferably formed upon a p-type substrate 2 and p-type epitaxial layer 4. The photodiode 12 preferably comprises a lightly doped n-type region within the epitaxial layer 4. The photodiode 12 has no refractory metal silicide 34 in order its surface. The reset transistor 16 must have its gate and drain silicided in order to retain desired transistor performance. The photodiode 12 can comprise a standard photodiode or a partially pinned photodiode as described in U.S. Pat. No. 6,051,447.

Figure 5:
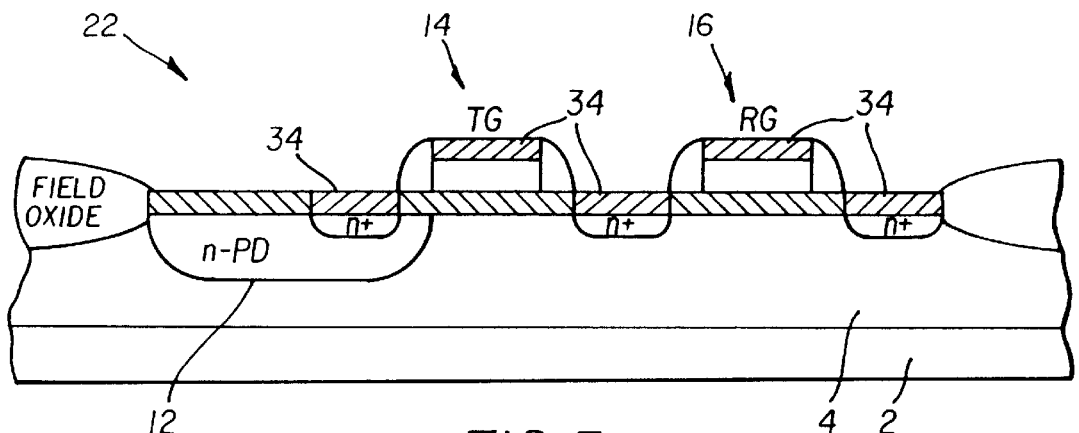
FIG. 5 is a cross sectional view of the photodiode region, transfer gate region, sensing node region, and reset transistor region of the CMOS APS pixel in FIG. 2.

FIG. 5 is a cross sectional diagram of the photodetector 12, adjacent transfer transistor structure 14, and reset transistor structure 16 of the active pixel 22 illustrated in FIG. 2. The cell 22, is preferably formed upon a p-type substrate 2 and p-type epitaxial layer 4. The photodiode 12 preferably comprises a lightly doped n-type region within the epitaxial layer 4. The photodiode 12 has no refractory metal silicide over its surface. The adjacent transfer transistor must have its gate and drain silicided 34 in order to retain desired transistor performance. The photodiode 12 can comprise a standard photodiode or a pinned photodiode as described in U.S. Pat. No. 5,625,210 incorporated herein by reference.

Figure 6:
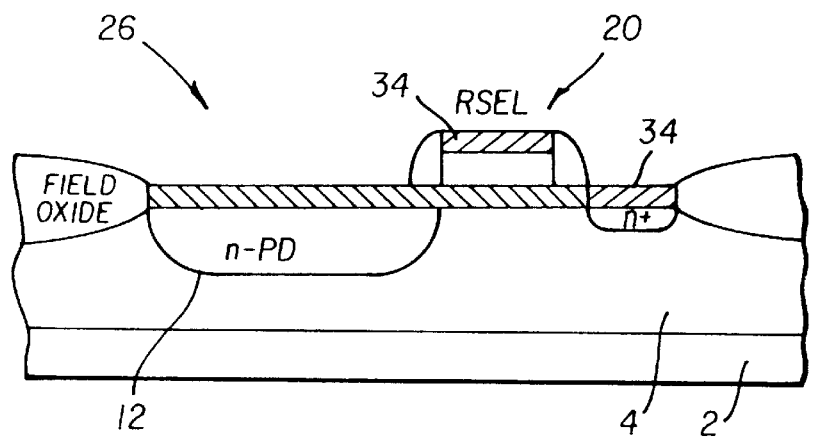
FIG. 6 is a cross sectional view of the photodiode region, and select transistor region of the CMOS PPS pixel in FIG. 3.

FIG. 6 is a cross sectional diagram of the photodetector and adjacent row select transistor structure of the passive pixel 26 illustrated in FIG. 3. The cell 10, is preferably formed upon a p-type substrate 2 and p-type epitaxial layer 4. The photodiode 12 preferably comprises a lightly doped n-type region within the epitaxial layer 4. The photodiode 12 has no refractory metal silicide over its surface. The row select transistor 20 must have its gate and drain silicided 34 in order to retain desired transistor performance. The photodiode 12 can comprise a standard photodiode or a partially pinned photodiode as described in U.S. Pat. No. 6,051,447.

In FIGS. 4, 5 and 6 the photodiode is formed by implants in active area regions that would normally be silicided as a result of the CMOS fabrication process. An extra mask and process steps are required to remove the silicide or prevent the silicide from forming over the photodiode so that the silicide does not form an effective light shield over the photodiode, thus severely reducing the quantum efficiency of the photodiode.

This invention provides a structure for a CMOS APS or PPS with a standard photodiode, pinned photodiode, or partially pinned photodiode, that does not require additional masking or process steps to provide an sensor having no refractory metal silicide over the photodiode. More specifically, as shown in FIGS. 7 through 12, the invention forms a photodiode 12 underneath the field oxide 40 normally formed in the CMOS process. The oxide layer 40 has a thickness sufficient to prevent the reaction of a deposited refractory metal with the silicon or polysilicon in the standard CMOS process and prevents the photodiode 12 from being silicided.

Figure 7:
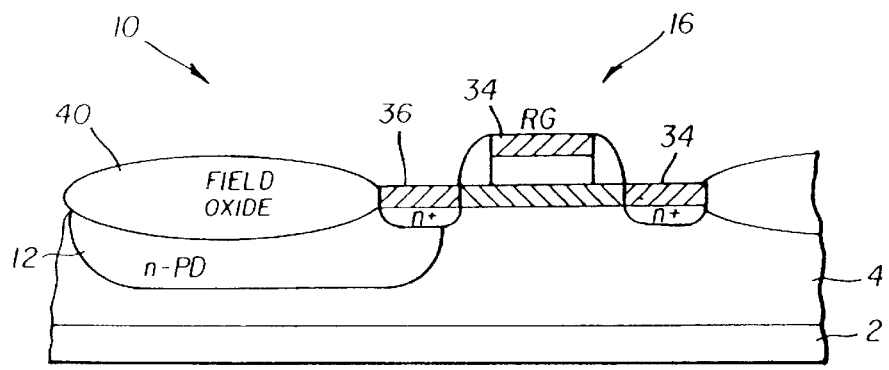
FIG. 7 is a cross sectional side view diagram of a photodetector and adjacent gate and drain region of a first pixel of the present invention.

FIG. 7 is a cross sectional diagram of the photodetector, and adjacent reset transistor structure 16 of a first active pixel cell as illustrated in FIG. 2. The cell 22, is preferably formed upon a p-type substrate 2 and p-type epitaxial layer 4. The photodiode 12 preferably comprises a lightly doped n-type region within the epitaxial layer 4. The photodiode 12 is formed under the field oxide 40. The adjacent reset transistor 16 must have its gate and drain silicided 34 in order to retain desired transistor performance. A portion of the photodetector must be silicided 36 in order to form an electrical connection between the photodiode 12 and gate of the source follower input transistor 16.

Figure 8:
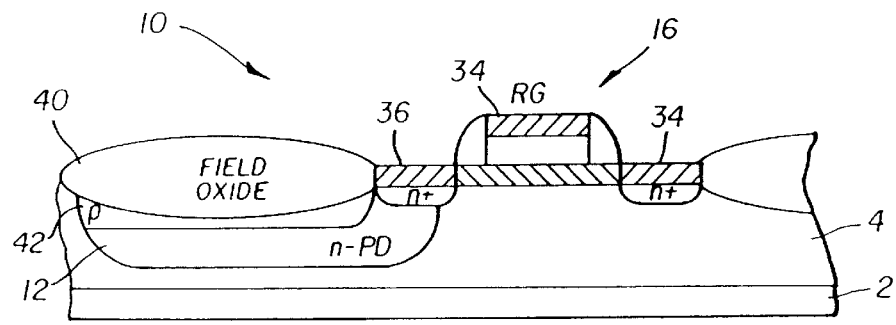
FIG. 8 is a cross sectional side view diagram of a photodetector and adjacent gate and drain region of a second pixel of the present invention.

The photodiode 12 can comprise a standard photodiode or a partially pinned photodiode as described in U.S. Pat. No. 6,051,447. This is shown in FIG. 8. Both the n-type photodiode 12 and p-type pinning layer 42 are formed underneath the field oxide 40.

Figure 9:
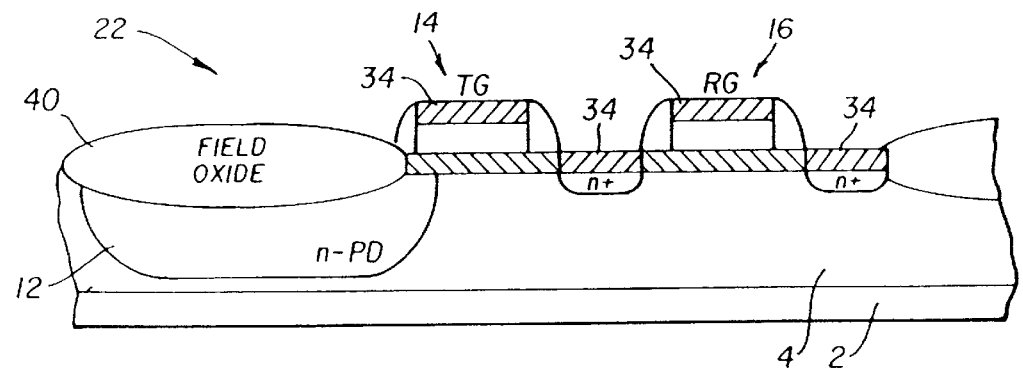
FIG. 9 is a cross sectional side view diagram of a photodetector, adjacent transfer gate, sense node region, and reset gate and drain region of a third pixel of the present invention.

FIG. 9 is a cross sectional diagram of the photodetector 12, adjacent transfer transistor structure 14, and reset transistor structure 16 of the active pixel schematic illustrated in FIG. 2. The cell 22, is preferably formed upon a p-type substrate 2 and p-type epitaxial layer 4. The photodiode 12 preferably comprises a lightly doped n-type region within the epitaxial layer 4 that is formed underneath the field oxide. The adjacent transfer transistor 14 must have its gate and drain silicided 34 in order to retain desired transistor performance. The reset transistor 16 must have its source, gate and drain silicided 34 in order to retain desired transistor performance.

Figure 10:
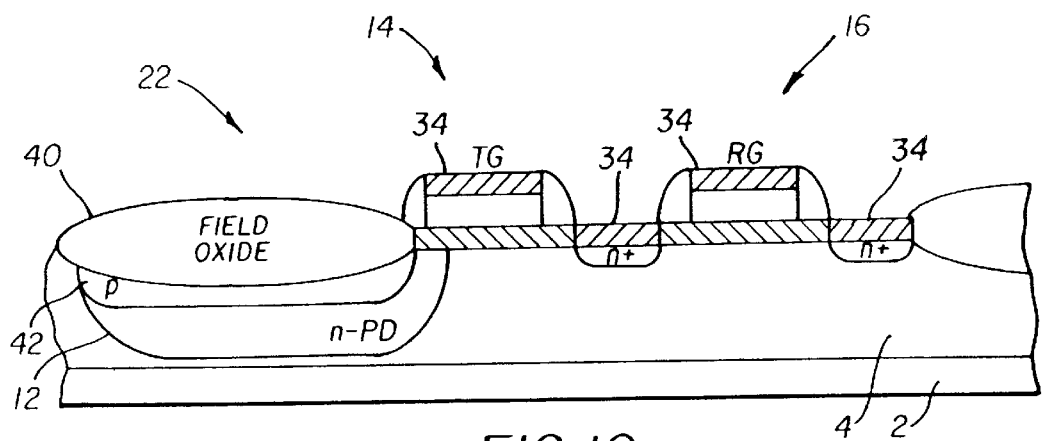
FIG. 10 is a cross sectional side view diagram of a photodetector, adjacent transfer gate, sense node region, and reset gate and drain region of a fourth pixel of the present invention.

The photodiode 12 can comprise a standard photodiode or a pinned photodiode as described in U.S. Pat. No. 5,625,210. This is shown in FIG. 10. Both the n-type photodiode 12 and p-type pinning layer 42 are formed underneath the field oxide 40.

Figure 11:
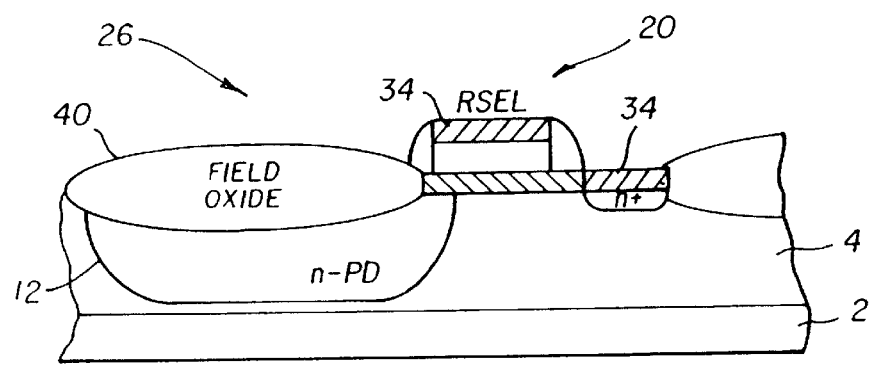
FIG. 11 is a cross sectional side view diagram of a photodetector and adjacent gate and drain region of a fifth pixel of the present invention.

FIG. 11 is a cross sectional diagram of the photodetector and adjacent row select transistor structure of the passive pixel schematic in FIG. 3. The cell 26, is preferably formed upon a p-type substrate 2 and p-type epitaxial layer 4. The photodiode 12 preferably comprises a lightly doped n-type region within the epitaxial layer 4 that is formed under the field oxide 40. The photodiode 12 has no refractory metal silicide over its surface. The row select transistor 20 must have its gate and drain silicided 34 in order to retain desired transistor performance.

Figure 12:
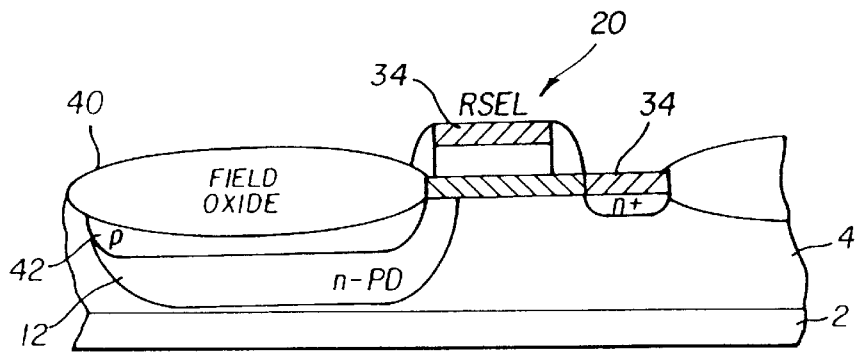
FIG. 12 is a cross sectional side view diagram of a photodetector and adjacent gate and drain region of a sixth pixel of the present invention.

The photodiode 12 can comprise a standard photodiode or a partially pinned photodiode as described in U.S. Pat. No. 6,051,447. This is shown in FIG. 12. Both the n-type photodiode 12 and p-type pinning layer 42 are formed underneath the field oxide 40.

The invention does not form a special field oxide over the photodiode to prevent silicidation. Instead, the invention forms the photodiode 12 under the standard field oxide 40 that is formed in conventional CMOS process for the CMOS device isolation.

In FIGS. 7 through 12, since the existing field oxide 40 is utilized over the photodiode 12, the invention eliminates the need to introduce an extra mask to prevent silicide 34 formation over the photodiode 12. This increases the efficiency of the production process. Further, by reducing the number of processing steps, the invention reduces the possibility of manufacturing defects as each additional processing step increases the possibility of defect formation.

To achieve a proper doping arrangement when forming the photodiode 12 beneath the field oxide 40, an n-type implant can be made in region 12 prior to the field oxide 40 growth or formation, or the impurity could be implanted through the field oxide 40 after the field oxide 40 has been formed. In the case of pinned photodiode pixels or partially pinned photodiode pixels (FIGS. 8, 10 and 12), the standard p-type field threshold adjust implant, or another p-type implant can be used to form the pinning layer 42 under the field oxide 40. Therefore, as would be known by one ordinarily skilled in the art given this disclosure, the invention is easily incorporated into standard CMOS processes and truly eliminates mask formation, patterning and removal steps.

While the invention has been described in terms of preferred embodiments, those skilled in the art will recognize that the invention can be practiced with modification within the spirit and scope of the appended claims.

| PARTS LIST | |
|---|---|
| 2 | p-type substrate |
| 4 | p-type epitaxial layer |
| 10 | CMOS active pixel sensor cell |
| 12 | photodiode (or photodetector) |
| 14 | transfer transistor |
| 16 | reset transistor |
| 18 | signal transistor |
| 20 | row select transistor |
| 22 | second conventional CMOS active pixel sensor cell |
| 24 | sensing node |
| 26 | conventional CMOS passive pixel sensor cell |
| 28 | pixel output |
| 34 | refractory metal silicide |
| 36 | silicided portion |
| 40 | field oxide |
| 42 | p-type pinning layer |
| RG | reset gate |

-continued

| PARTS LIST | |
|---|---|
| VDD | voltage supply |
| RSEL | row select gate |
| TG | transfer gate |

What is claimed is:

1. A complementary metal oxide semiconductor (CMOS) active pixel sensor (APS) comprising a plurality of pixels; at least one of said pixels comprising:
   a photodetector;
   a transistor adjacent said photodetector, said transistor including a silicide surface; and
   an insulator over said photodetector, wherein said insulator has a thickness sufficient to prevent said silicide surface from forming over said photodetector.

2. The CMOS APS in claim 1, wherein said insulator comprises a field oxide.

3. The CMOS APS in claim 1, wherein said photodetector comprises a pinned photodiode and said CMOS APS further comprises a pinning layer between said photodetector and said insulator.

4. The CMOS APS in claim 1, further comprising a silicon substrate, wherein said photodetector comprises a doped region in said silicon substrate.

5. The CMOS APS in claim 1, wherein said transistor comprises a reset transistor having a silicided source region adjacent said photodetector, a silicided gate adjacent said source region and a silicided drain region on an opposite side of said gate from said source.

6. The CMOS APS in claim 1, wherein said transistor comprises a row select transistor having a silicided gate adjacent said photodetector and a silicided drain region on an opposite side of said gate from said photodetector.

7. A complementary metal oxide semiconductor (CMOS) pixel sensor comprising a plurality of pixels; at least one of said pixels comprising:
   a photodetector;
   a transistor adjacent said photodetector, said transistor including a silicide surface; and
   an insulator over said photodetector, wherein said insulator has a thickness sufficient to prevent said silicide surface from forming over said photodetector.

8. The CMOS pixel sensor in claim 7, wherein said insulator comprises a field oxide.

9. The CMOS pixel sensor in claim 7, wherein said photodetector comprises a pinned photodiode and said CMOS further comprises a pinning layer between said photodetector and said insulator.

10. The CMOS pixel sensor in claim 7, further comprising a silicon substrate, wherein said photodetector comprises a doped region in said silicon substrate.

11. The CMOS pixel sensor in claim 7, wherein said transistor comprises a reset transistor having a silicided source region adjacent said photodetector, a silicided gate adjacent said source region and a silicided drain region on an opposite side of said gate from said source.

12. The CMOS pixel sensor in claim 7, wherein said transistor comprises a row select transistor having a silicided gate adjacent said photodetector and a silicided drain region on an opposite side of said gate from said photodetector.

* * * * *